United States Patent [19]
Fromson et al.

[11] Patent Number: 5,826,513
[45] Date of Patent: Oct. 27, 1998

[54] METHOD AND APPARATUS FOR PUNCHING AND IMAGING A CONTINUOUS WEB

[75] Inventors: Howard A. Fromson, 49 Main St., Stonington, Conn. 06378; William J. Rozell, Vernon, Conn.; Paul C. Schunk, East Longmeadow, Mass.

[73] Assignee: Howard A. Fromson, Stonington, Conn.

[21] Appl. No.: 955,041

[22] Filed: Oct. 21, 1997

[51] Int. Cl.⁶ .................................................. G03F 7/20
[52] U.S. Cl. ...................... 101/463.1; 101/467; 101/485; 347/248; 347/264
[58] Field of Search .................... 101/401.1, 463.1, 101/465, 466, 467, 477, 485, 486, DIG. 36; 347/116, 248, 262, 264; 430/300, 302, 204; 355/85, 86, 91, 94, 97, 99, 103

[56] References Cited

U.S. PATENT DOCUMENTS

| | | | |
|---|---|---|---|
| 3,848,998 | 11/1974 | Yonekura et al. | 355/85 |
| 4,092,925 | 6/1978 | Fromson | 101/401.1 |
| 4,419,009 | 12/1983 | Nakamura et al. | 355/103 |
| 5,094,933 | 3/1992 | Uhrig | 101/467 |
| 5,165,062 | 11/1992 | Ogura et a. | 355/85 |
| 5,255,607 | 10/1993 | Nishiyama et al. | 101/463.1 |
| 5,345,870 | 9/1994 | Bailey et al. | 101/463.1 |
| 5,579,092 | 11/1996 | Isobe et al. | 347/116 |
| 5,686,999 | 11/1997 | Mizuno et al. | 347/116 |
| 5,701,170 | 12/1997 | Powers et al. | 355/85 |
| 5,713,504 | 2/1998 | Arai et al. | 226/183 |

Primary Examiner—Stephen R. Funk
Attorney, Agent, or Firm—Alix, Yale & Ristas, LLP

[57] ABSTRACT

A web is punched with registration holes and imaged prior to cutting the web into individual imaged plates particularly for use as printing plates. The web with an imageable surface is serially punched, imaged and sheeted with the punched holes being utilized to assure registration and alignment in the imaging operation and in the subsequent use of the plates on a printing press. The punching and imaging may be performed at separate stations or at a single punching and imaging station. The web is preferably advanced under tension and tension and/or vacuum may be used to hold the web flat on the imaging platen.

17 Claims, 3 Drawing Sheets

METHOD AND APPARATUS FOR PUNCHING AND IMAGING A CONTINUOUS WEB

The present invention relates to a method and apparatus for punching and imaging a planar material from a continuous web, and subsequently cutting the web into discrete sheets. More particularly, it relates to a method and a device for punching registration holes and imaging a web which is subsequently cut into discrete lithographic printing plates. The present invention assures that the plates are imaged and cut with improved alignment and subsequent registration on the printing press.

BACKGROUND OF THE INVENTION

In the typical process for the formation of lithographic printing plates, the sensitized web of lithographic plate stock is cut into individual plates and stacked prior to imaging. The individual plates are optionally separated by individual sheets of interleaving paper where needed to protect the integrity of the coating. To image the plates, each individual plate is picked up from the stack, the interleaving paper is removed when present, and the plate is transferred to the imaging device. The imaging device may be of the internal drum type, the external drum type or of the flat bed design. After positioning the plate in the imaging device, vacuum is typically employed to hold the plate securely in place. Once the image is formed, the vacuum is released and the plate is removed from the imaging device. U.S. Pat. No. 5,619,246 discloses an apparatus for loading and unloading of individual plates into an imaging device. Where punched plates are desired, the individual plates are optionally punched prior to or subsequent to the imaging process as a discrete, separate operation. Such prior art processes require considerable material handling equipment and consume a lot of time.

SUMMARY OF THE PRESENT INVENTION

The present invention simplifies the process and equipment for producing punched, imaged and sheeted printing plates. An object of the invention is to punch the web with registration holes and image the web prior to cutting the web into individual imaged plates. A web of material with an imageable surface is serially punched, imaged and sheeted (cut) in a continuous process. The web is advanced through the punching and imaging steps into a set of pull rolls and then passed to a sheeter where it is cut into discrete sheets. The punching and imaging may be performed at separate stations or at a single punching and imaging station. The punched holes are utilized to assure registration and alignment in the imaging and sheeting operations. The web is preferably advanced under tension and tension and/or a vacuum may be used to hold the web flat during the operations. The present invention thus simplifies the process of obtaining finished, imaged sheets, by combining several discrete process steps into a continuous process. Further, the time required to image individual sheets is reduced since the present invention allows the imageable web to be loaded into the imaging device as the already imaged area of the web is being removed. Since all operations are controlled with improved precision, the subsequent alignment and registration of the finished plates is greatly improved.

DESCRIPTION OF THE PREFERRED EMBODIMENT

The present invention relates to the imaging of any suitable web with an imageable surface where the desired resultant article is discrete, imaged sheets. In the preferred embodiment, the web of material is suitable for the formation of printing plates. The web will typically be a grained, anodized aluminum stock having a sensitized coating which is imageable by exposure to actinic radiation in the infrared, visible or ultraviolet wavelength ranges in a manner well known to those skilled in the art. The invention is particularly suited for but not limited to lithographic printing plates.

Figure 1:
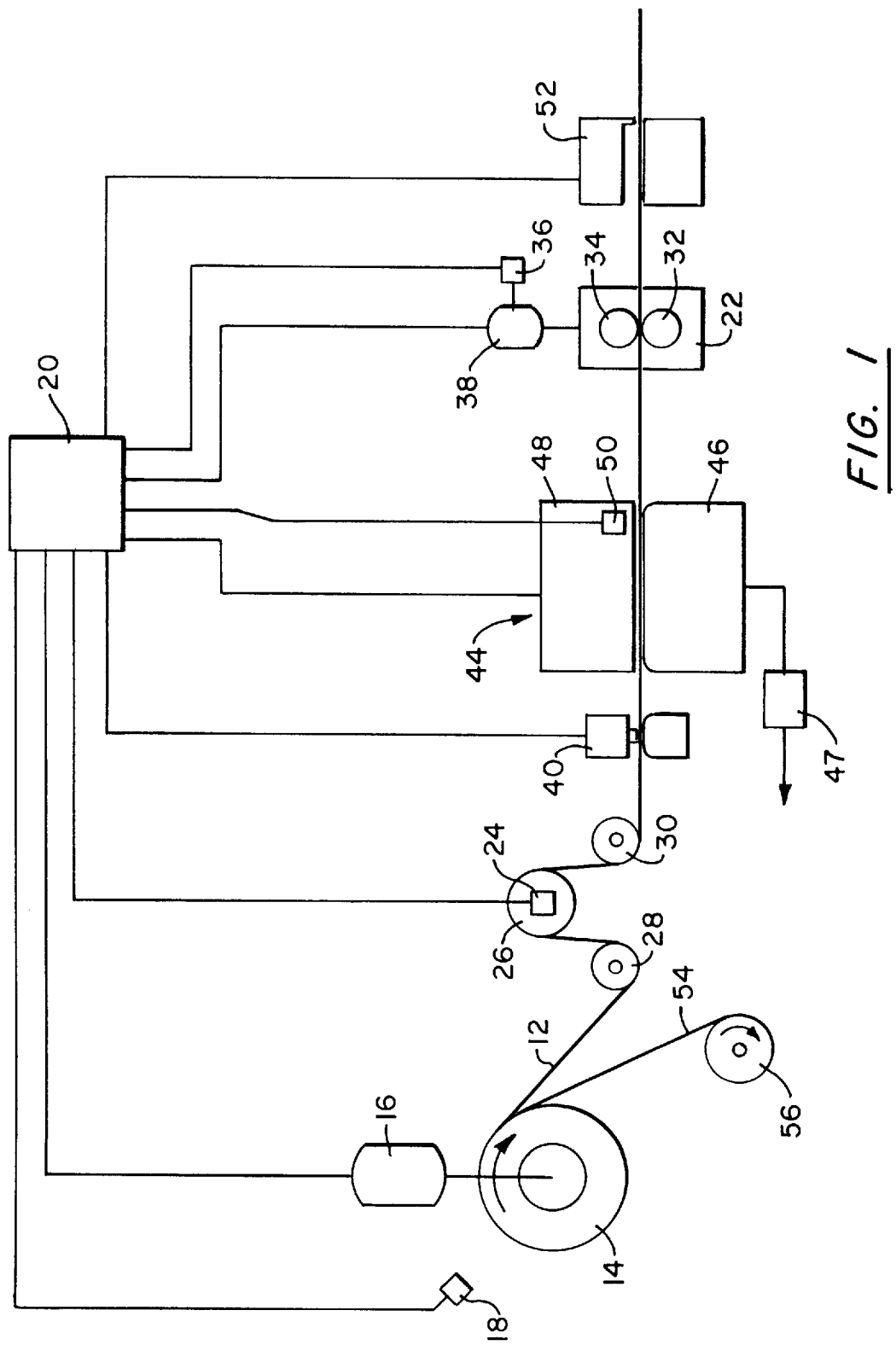
FIG. 1 is an illustration of a process line illustrating the method and the equipment for practicing the present invention.

FIG. 1 illustrates a web of imageable printing plate stock 12 coming off the unwind reel 14. The unwind reel 14 is driven by a controlled power source such as motor 16 with regenerative capabilities as known in the art. Such a device is capable of operating in reverse or of applying negative torque. A diameter sensing device 18 is used to provide a signal to the control system 20 representing the current diameter of the web on the unwind reel. Any suitably accurate distance-measuring device can be used. This diameter is required by the control system to accurately calculate the proper revolutions per minute of the unwind reel and thus control the speed of the motor 16 to set the proper web speed. The control system 20 is merely a conventional type of timing sequencing and calculating device to control the various functions of the entire process as discussed later.

Web tension is created by the pull roll system 22 providing a forward pull on the web and the unwind reel 14 providing the back tension through the motor 16. Web tension is sensed by a linear variable-differential transformer (LVDT) transducer or a stain gauge or similar known tension sensing device 24 associated with the roll 26. For example, the pillow blocks for the journals of the roll 26 can be mounted on the transducers which will then produce a signal proportioned to the force of the web on the roll 26 and thus proportional to the web tension. Rolls 28 and 30 maintain a constant angle of wrap of the web around the roll 26. The tension feedback signal from. 24 is utilized by control system 20 to determine the proper control parameters of speed and torque for motor 16 thereby insuring that the proper web tension is maintained.

The primary control of the registration in the process line is the pull roll system 22. The pull roll system 22 consists of two feed rolls 32 and 34 that are ground to a precisely controlled diameter. An optical encoder 36 is mounted on the pull roll drive motor 38 or one of the pull rolls. The optical encoder 36 determines the length of the web as the web advances to the next position and will feedback the position to the control system 20. The feed rolls are conventional intermittently driven types of feed rolls which engage the web and intermittently move the web forward a predetermined distance equivalent to the size of one printing plate as set into the control system 20.

Figure 2:
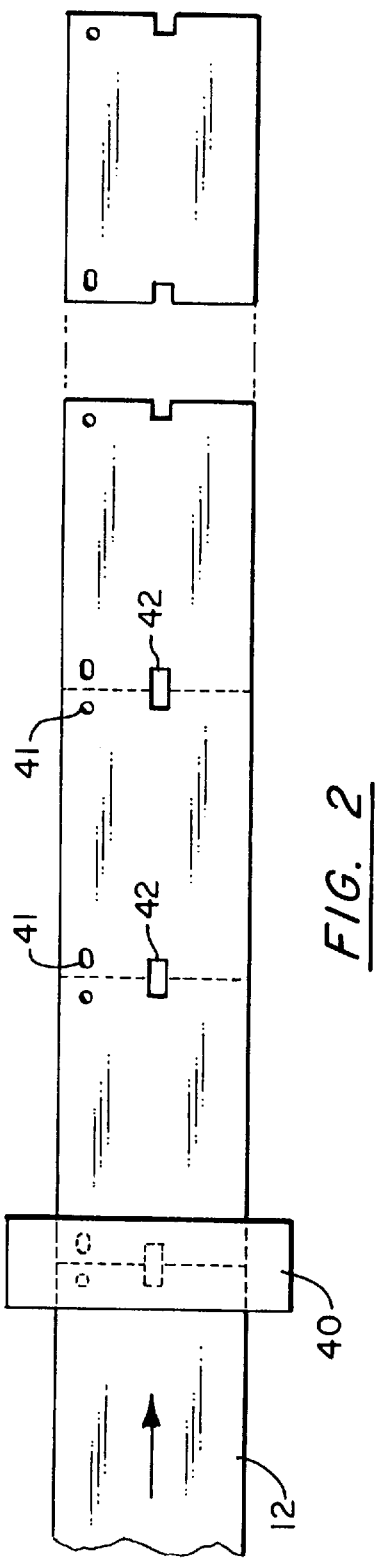
FIG. 2 is a top view of straight grain punched web according to the invention.
Figure 3:
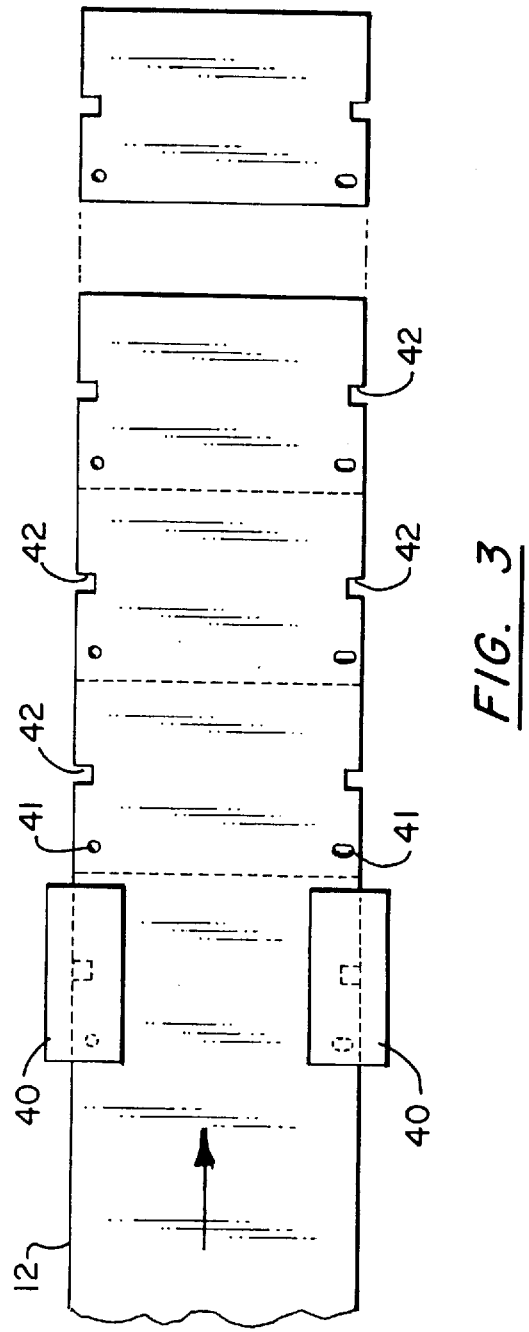
FIG. 3 is another top view of a punched web showing a cross grain form of punching.

Following the roll 30 is a punching mechanism 40 as known in the art for punching registration apertures in the web. Examples are the holes 41 and notches 42 as shown in FIGS. 2 and 3. These holes and notches may be of any desired configuration and they may be straight grain punches as shown in FIG. 2 (across the web) or cross grain punches as shown in FIG. 3 (lengthwise along the edges of the web). The notches 42 are for registration on the printing press while the holes 41 are typically used for registration in the equipment for forming the bend in the ends of the plates for mounting on the press cylinder. Since the registration notches and the bending holes, if required for bending, are pre-registered to the imaging system, the invention provides a very accurate registration system on press.

From the punching mechanism 40, the punched web is fed to the imaging station generally designated 44. This comprises a platen 46 and an imager 48. The punched web 12 is fed onto the platen 46 and is stopped in the proper position by the position sensor 50, such as an optical sensor, which detects an appropriate punched hole 42. This then provides for the indexing of the web to each successive position. The sensor 50 is ideally located within the imaging station 44 thus insuring the highest degree of accuracy in the imaging process. The control signal generated by position sensor 50 is used by control system 20 to identify the web stopping position and insure the accurate position of the punched features 42 in the imaging station 44. With the web 12 at a stationary position on the platen 46, the web is imaged by the imaging device 48 which, for example, might be any conventional laser or other imager. Upon completion of the imaging, the controller 20 again triggers the web to move forward the required amount ready for the next image.

The web 12 is maintained flat on the platen 46 by the web tension or by a vacuum which is drawn on the interface between the web and the platen by the vacuum pump 47. For example, the surface of the platen may contain a series of small holes connected with the vacuum pump 47 by appropriate channels. Also, a combination of web tension and vacuum may be used. A unique feature is that the vacuum need not be cycled on and off since the web can be moved across the platen in the direction perpendicular to the pull of the vacuum without releasing the vacuum.

Following the pull roll system 22 is a shear device 52 which cuts the web into individual plates. The shear device 52 is also controlled by the controller 20 and is preferably located an exact distance from the position sensor 50 that is a multiple of the desired plate length. Since the accuracy of the shear cut-off length is determined by this distance, the cutter is preferably located as close to the feed rolls as practical to minimize any accumulative errors. After cutting, the plates can be sent to a washing station which is not shown.

The imageable surface of the web 12 is on the upper surface as depicted in FIG. 1. Since the imageable surface is often a coating which should be protected, the web may be rolled together with an interleaving web of paper 54 which is located between each layer of the web 12 on the reel and protects the coating from the adjacent back-side of the web 12. As can be seen in FIG. 1, this paper web 54 is separated from the printing plate web 12 as it is unreeled. The paper web can then merely be rolled onto the spool 56 for disposal or reuse. The rotation of the spool 56 is controlled by the control unit 20.

Figure 4:
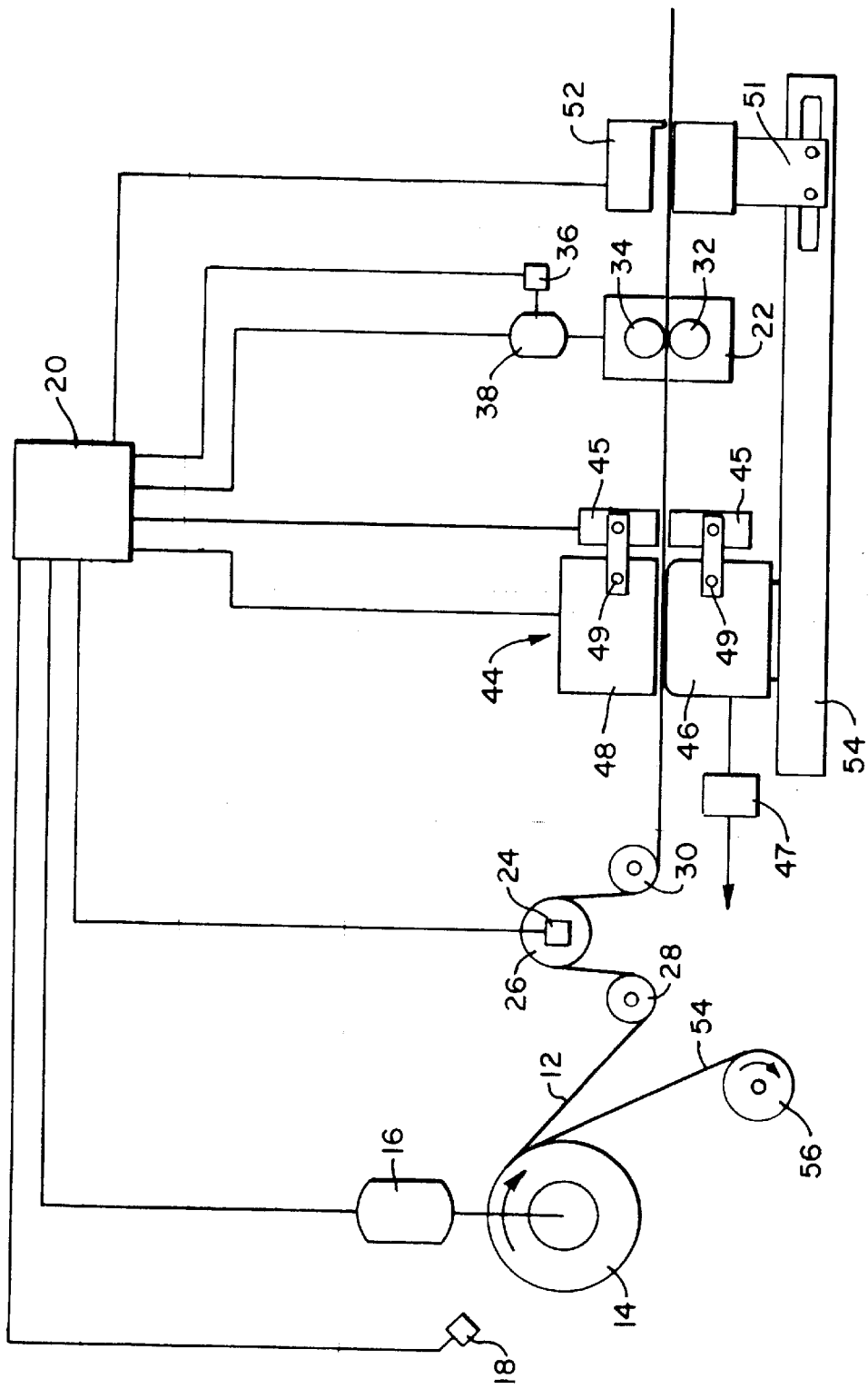
FIG. 4 is an illustration of a process line illustrating an alternate embodiment of the present invention.

Another embodiment of the present invention is shown in FIG. 4 which illustrates several alternate features of the invention. In this embodiment, although the punching and imaging steps are performed serially, they are performed at a single station. In this arrangement, the imaging station which is again generally designated 44, comprises not only an imaging platen 46 and an imager 48 but also punching means 45. The punching means 45 is mounted in the imaging station at 49 so that it is adjustable in relationship to the platen and imager. In this way, the punching can be adjusted with respect to the image area on the web and then fixed in that position. The punching and imaging take place serially without moving the web. In fact, the punches of the punching means 45 may optionally be maintained in engagement through the holes or notches in the web while the imaging operation is performed. This holds the web in a fixed position so that the punched holes and images are in total registration with each other. After imaging, the punches are disengaged by the control system 20 and the web is advanced to the next punching and imaging area. Since the registration on the printing press uses the same registration means, the plates and images are perfectly registered on the press. Although the punching means 45 has been shown downstream from the imager, it could be upstream or on the sides of the imager.

In the FIG. 4 embodiment, an arrangement is illustrated for adjusting the position of the cutter 52 with respect to the punching and imaging. In this generally illustrated arrangement, the imaging station is mounted on a base 54. The cutter 52 is adjustably mounted at 51 on the same base 54. By this adjustable mounting means, the exact plate cut off position can be obtained. Such an adjustable mounting arrangement can also be use in the FIG. 1 embodiment.

There are a number of advantages of the present invention over the prior art. The punching, imaging and cutting are performed as a continuous operation instead of as individual, discrete processing steps. This eliminates the time and equipment for the handling of individual plates between each step. The time for imaging is reduced over the prior art since the web to be imaged can be fed into the imager as the already imaged region is being removed. Further, the use of vacuum to hold the web during imaging is optional. In some applications, the web tension will be sufficient to secure the web in position on the flat surface of the platen. Where desirable, vacuum may be used, but since the web is transported along the imaging surface in a direction transverse to the pull of the vacuum, the vacuum need not be cycled on and off during the loading and unloading operations. Thus a time savings can be realized even where vacuum is employed. Also, where interleaving paper is used, the cumbersome handling of individual interleaving sheets is replaced by a simple rewind device for a continuous web of paper.

An additional advantage lies in the fact that the punching, imaging and cutting are done in a way so as to assure alignment and registration with much greater precision than the prior art. By punching and imaging while maintaining a flat web and indexing the process for the imaging and sheeting operations from the punched holes, the finished plates can be prepared with a greatly improved registration when mounted on a press, resulting in a reduction of losses on start-up of the press. This alleviates the need for the costly and time consuming optical bending as is currently often used in the printing industry for registration.

We claim:

1. Apparatus for serially punching and imaging a planar imageable continuous web material and subsequently cutting said web into individual sheets for the production of punched and imaged separate plates comprising:

a. means for periodically advancing said continuous web material from a source through said apparatus in steps of a desired plate length;

b. punching means for punching registration holes in said web material at intervals corresponding to said desired plate length;

c. an imaging station following said punching means including means for producing an image on a portion of said imageable web material located in said imaging station;

d. cutting means for cutting said imaged web material into separate imaged plates of said desired length; and e. means for positioning said web material in said imaging station comprising means for sensing said registration holes.

2. Apparatus as recited in claim 1 and further including means for maintaining said web material under tension through said punching means and said imaging station.

3. Apparatus as recited in claim 2 wherein said means for maintaining said web material under tension comprises a supply reel for said web material, feed rolls for pulling said web from said supply reel through said punching means and said imaging station, drive means for said supply reel, web tension sensing means and means responsive to said web tension sensing means for controlling said drive means to maintain a desired web tension.

4. Apparatus as recited in claim 3 wherein said means for positioning said web material includes control means for activating and deactivating said feed rolls and said drive means in response to said means for sensing said registration holes.

5. Apparatus as recited in claim 4 wherein said means for sensing said registration holes is located in said imaging station.

6. Apparatus as recited in claim 3 wherein said drive means includes means for detecting the diameter of said web material on said supply reel and for controlling the speed of said supply reel.

7. A method of forming individual printing plate images onto a continuous web of flexible printing plate stock containing an imageable surface thereon wherein said continuous web is wound on a supply reel comprising the steps of:

a. intermittently unwinding said web of printing plate stock from said supply reel into a punching mechanism and punching holes at selected locations in said web of printing plate stock;

b. intermittently passing said web of printing plate stock from said punching mechanism into an imaging station having a flat imaging platen while maintaining tension to hold said printing plate stock flat on said imaging platen;

c. stopping said printing plate stock on said imaging platen and imaging said printing plate stock on said imaging platen with a desired image;

d. intermittently pulling said web of imaged printing plate stock from said imaging platen while maintaining said tension; and e. cutting said web of imaged printing plate stock into individual printing plates.

8. A method as recited in claim 7 wherein said continuous web is wound on said supply reel together with an interleaving protective web and comprising the step of removing said protective web onto a protective web reel as said continuous web is unwinding from said supply reel.

9. A method of imaging individual areas on an elongated web of flexible material containing an imageable surface thereon wherein said imaging is preformed on a flat imaging platen comprising the steps of:

a. moving said web under tension in a path through a punching device and onto and across said platen;

b. stopping said web in a desired position for punching said web and for imaging a desired area of said web;

c. punching said web and forming said image on the imageable surface of said web in said area; and d. cutting said web containing said imaged areas into individual imaged sheets.

10. A method of imaging individual printing plate areas on an elongated web of flexible printing plate stock containing an imageable surface wherein said imaging is preformed on a generally horizontal flat imaging platen comprising the steps of:

a. extending said web in a path through a punching mechanism and onto and across said platen;

b. periodically moving said web stepwise along said path, each periodic stepwise movement moving said web to a desired position for punching registration holes in said web and for imaging an individual printing plate area on said web;

c. stopping said web in said desired position while maintaining tension on said web through said punching mechanism and on said platen;

d. punching said registration holes in said web before said web moves onto said platen and while said web is stopped;

e. forming said image on the imageable surface of said web in said area while said web is stopped;

f. moving said web to a next desired position and repeating steps c, d and e; and g. cutting said web between said areas thereby forming separate punched and imaged printing plates.

11. A method of imaging individual printing plate areas on an elongated web of printing plate stock containing an imageable surface wherein said imaging is performed in an imaging station containing a horizontal flat imaging platen and web punching means comprising the steps of:

a. moving said web across said imaging platen and through said punching means of said imaging station and stopping said web in a first position for punching and imaging a first section of web;

b. punching registration holes in said stopped web and then imaging said stopped web while maintaining said stopped web in said first position;

c. moving said web to a second position and stopping said web in said second position for punching and imaging a second section of said web;

d. repeating step (b) of punching and imaging in said second position; and e. subsequently cutting said punched and imaged sections into individual printing plates.

12. A method as recited in claim 11 wherein said web punching means is maintained in engagement with said web during said imaging.

13. A method of imaging individual areas on an elongated web of flexible material containing an imageable surface thereon wherein said imaging is preformed on a flat imaging platen comprising the steps of:

a. moving said web under tension in a path through a punching device and across said platen;

b. stopping said web in a desired position for punching and imaging said web in a desired individual area of said web;

c. punching and forming said image on the imageable surface of said web in said desired individual area; and d. cutting said web containing said imaged and punched individual areas into individual punched and imaged sheets.

14. A method as recited in claim 13 wherein said step of punching precedes said step of forming said image.

15. A method of imaging individual printing plate areas on an elongated web of flexible printing plate stock containing an imageable surface wherein said imaging is preformed on a generally horizontal flat imaging platen comprising the steps of:

a. extending said web in a path through a punching mechanism and across said platen;
   b. periodically moving said web stepwise along said path, each periodic stepwise movement moving said web to a desired position for punching registration holes and for imaging an individual printing plate area on said web;
   c. stopping said web in said desired position while maintaining tension on said web through said punching mechanism and on said platen;
   d. while said web is stopped, punching said registration holes in said individual printing plate area of said web and forming said image on the imageable surface of said web in the same individual printing plate area of said web;
   e. moving said web to a next desired position and repeating steps c and d; and
   f. cutting said web between said individual printing plate areas thereby forming separate punched and imaged printing plates.

16. A method as recited in claim 15 wherein said step of punching precedes said step of forming said image.

17. A method of imaging individual printing plate areas on an elongated web of printing plate stock containing an imageable surface wherein said imaging is performed in an imaging station containing a horizontal flat imaging platen and web punching means comprising the steps of:

a. moving said web across said imaging platen and through said punching means of said imaging station and stopping said web in a first position for punching and imaging a first section of web;
   b. imaging said stopped web and punching registration holes in said stopped web while maintaining said stopped web in said first position;
   c. moving said web to a second position and stopping said web in said second position for imaging and punching a second section of said web;
   d. repeating step (b) of imaging and punching in said second position; and
   e. subsequently cutting said imaged and punched sections into individual printing plates.

* * * * *